(12) United States Patent
Savaria et al.

(10) Patent No.: US 6,928,606 B2
(45) Date of Patent: Aug. 9, 2005

(54) FAULT TOLERANT SCAN CHAIN FOR A PARALLEL PROCESSING SYSTEM

(75) Inventors: Yvon Savaria, Montréal (CA); Meng Lu, Montréal (CA)

(73) Assignee: Hyperchip Inc, Montreal (CA)

( * ) Notice: Subject to any disclaimer, the term of this patent is extended or adjusted under 35 U.S.C. 154(b) by 403 days.

(21) Appl. No.: 10/323,896

(22) Filed: Dec. 20, 2002

(65) Prior Publication Data

US 2003/0120987 A1 Jun. 26, 2003

Related U.S. Application Data

(60) Provisional application No. 60/341,238, filed on Dec. 20, 2001.

(51) Int. Cl.[7] .......................... G06F 11/08; G01R 31/28
(52) U.S. Cl. ........................................ 714/797; 714/729
(58) Field of Search ................................ 714/797, 729, 714/760, 726, 727, 733, 734, 724, 30; 326/11, 10, 9

(56) References Cited

U.S. PATENT DOCUMENTS 4,621,201 A * 11/1986 Amdahl et al. ............... 326/11
4,774,709 A * 9/1988 Tulplue et al. ................. 714/4
6,334,198 B1 * 12/2001 Adusumilli et al. ......... 714/727
6,480,019 B2 * 11/2002 Waldie et al. ................ 326/16
6,646,460 B2 * 11/2003 Whetsel ....................... 324/763

* cited by examiner

Primary Examiner—Christine T. Tu
(74) Attorney, Agent, or Firm—Ogilvy Renault LLP

(57) ABSTRACT

A highly robust fault tolerant scan chain is designed for scanning (and/or controlling a configuration of) a parallel processing system. The scan chain implements parallel redundant scan chains that follow physically diverse paths through the parallel processing system. For each IC under test, a set of redundant TAPs perform a boundary scan, and the test results are combined by voting. The TAPs of each set are physically diverse, in that they are physically located in separate power domains of the parallel processing system. As a result, the scan chain is robust to faults affecting power and/or control signal supply to any one power domain. Respective input and output dummy cells at opposite extreme ends of the scan chain provide a graceful separation and recombination of the redundant parallel scan chains, and so renders the architecture of the scan chain transparent to external boundary scan circuit elements.

18 Claims, 6 Drawing Sheets

FAULT TOLERANT SCAN CHAIN FOR A PARALLEL PROCESSING SYSTEM

CROSS-REFERENCE TO RELATED APPLICATIONS

This is the first application filed for the present invention.

This application claims priority to U.S. Provisional Patent Application No. 60/341,238, filed Dec. 20, 2001 which are incorporated herein by reference.

MICROFICHE APPENDIX

Not Applicable.

TECHNICAL FIELD

The present invention relates to parallel processing systems, and in particular to a fault tolerant scan chain for a parallel processing system.

BACKGROUND OF THE INVENTION

Complex electronic systems are typically designed using multiple integrated circuit (IC) packages mounted on a printed circuit board with interconnects between the packages provided by traces on the printed circuit board. This approach to system design is highly versatile, because a designer can develop a wide range of different systems by selecting from a comparatively limited number of standard IC packages having well defined functionality. Isolation and correction of defects is also simplified, because each IC package can be tested individually, and any packages found to be defective can be replaced. In the case of parallel processing systems, this modular design approach is frequently extended by placing each processor element (and its associated interface, memory, and power management devices) on a single printed circuit (PC) board. Several such PC boards are then connected to a communications "backplane" to construct the parallel processing system.

Well known disadvantages of the use of such a modular design approach include the comparatively large physical distances separating each IC of the system (which adversely affects system speed), and increased system noise due, among other things, to Radio Frequency Interference (RFI) and impedance mismatches between "on-chip" circuit traces and the PC board lines between the IC packages. All of these factors negatively impact system performance. Designers have recognized that wafer-scale integration (WSI); that is, the manufacture of entire systems (or major system components) on a single wafer provides an effective means of maximizing system performance by simultaneously addressing both of these limitations.

However, a primary limiting factor in integrated circuit fabrication is that, as the size of an IC increases, so does the probability that manufacturing defects (e.g., a dust particle on the surface of the IC or physical defects in the IC) will damage at least part of the circuitry on the wafer. This problem is typically expressed in terms of "yield"; that is, the number of serviceable IC's that can be manufactured from each wafer. With current manufacturing methods using 30 cm diameter wafers (approx. 700 cm$^2$ surface area), the yield for IC's covering about 5 mm$^2$ is close to 100%. By contrast, for IC's of about 5 cm$^2$, the yield can be up to about 80% depending on process maturity. As the size of an IC increases toward the total wafer area, the expected yield drops to close to zero, thereby effectively prohibiting the development of practical systems covering the entire surface of the wafer.

For the purposes of the present disclosure, a "defect" shall be understood to refer to a physical disturbance or an anomaly that affects a manufactured component. Common sources of defects include dust particles on a wafer surface during manufacture. A "fault" shall be understood to refer to a change or anomaly in the logical behavior of one or more components. In many cases, defects will produce faults, and thus can be inferred from detected anomalous behavior of an IC. However, this is not always the case; some faults are not related to defects, and some defects do not produce faults. An example of the later case is a fault that pinches, but does not sever a wire.

Various techniques are known for producing fault-tolerant IC's. For example, U.S. Pat. No. 4,621,201 to Amdahl et al. teaches a fault-tolerant IC system in which plural copies of each circuit are manufactured on a single wafer. Predetermined circuit element groups of the copies are interconnected, following manufacture, to assemble the working system. According to Amdahl et al., a majority voting scheme is used, which requires at least triple redundancy for each circuit to be protected. Alternatively, fused links can be used to statically remove defective elements from the circuit. This implies having at least a one-for-one redundancy for each circuit to be protected.

Both of these techniques imply a highly inefficient utilization of the surface of the wafer. In particular, the technique of Amdahl et al. results in a utilization efficiency of about 33%, while the use of fused links achieves, at best, a 50% efficiency. Successful implementation of WSI systems requires a fault-tolerant system architecture that remains serviceable in the presence of manufacturing defects, while maximizing utilization efficiency of the wafer surface.

Another difficulty with WSI is the size of the reticle used for generating circuit traces and components on the surface of the wafer. In practice, the largest usable reticle covers an area of about 2 cm×2 cm, so that multiple reticle images must be used to cover the entire wafer. However, the cost of preparing multiple unique reticles for a single wafer is prohibitive. In the case of a parallel processing system, each processor element of the system can be identical, and a reticle image may cover one or more processor elements. Thus, in principle, a single reticle could be used to generate every processor element. However, the connectivity of each processor element to associated communications busses must necessarily be unique. Development of a cost-effective WSI parallel processing system requires a system architecture in which a single reticle can generate multiple cells of the parallel processing system, each cell having a unique connectivity to a communications bus.

As noted above, defects during manufacture cannot be entirely eliminated. It is therefore essential to be able to determine the operability of each cell (and bus) of a system following manufacture. Traditional techniques, such as functional or "edge connector" tests, and in-circuit or "bed-of-nails" testing are impractical for WSI parallel processing systems. Currently, boundary scan testing is one of the best practical ways of detecting faults in highly complex digital integrated circuits. Boundary scan testing uses built-in test logic to verify the operation of internal elements (including the absence of manufacturing defects) of complex systems and integrated circuits. The Joint Test Access Group (JTAG) has developed a boundary scan test implementation that is the only systematic technique that has been standardized for this task, and is sanctioned by the Institute of Electrical and Electronic Engineers (IEEE) under standard 1149.1.

According to the IEEE 1149.1 standard, a standard Test Access Port (TAP) is located "on chip" for testing each IC of the system. Each TAP has a closely similar structure, including Instruction, Bypass, and test data registers, as well as instruction decode logic, output multiplexers and TAP controller logic for controlling operation of the TAP. In a WSI parallel processing system, each cell may include one or more TAPs for testing the cell's processor element and associated circuitry. Every TAP of the system is connected, in series, on a four- or five-wire "scan chain bus" to form one or more continuous "scan chains" spanning the entire system. Each scan chain has an external appearance (that is, from the point of view of external system test logic) of a linear shift register, in which every TAP can be represented by a unique set of addresses. This enables each TAP to be individually accessed to test specific IC's of the system, and test results obtained for analysis. As a result, IEEE 1149.1 provides an efficient system for testing very complex systems, such as WSI parallel processing systems. The individual accessibility provided by IEEE 1149.1 is often used for other tasks such as boot-strapping, debugging and configuring.

However, implementation of a boundary scan system requires that several TAPs be connected, in series, on a common scan chain. In a system architecture that uses a single reticle to image every cell of a parallel processing system, it is desirable to incorporate traces for this scan chain into the common reticle. This means that scan chain bus traces will be identically duplicated in every reticle image. Within a matrix of identical cells on a wafer, this situation is satisfactory, yielding desired scan chain bus lines and connections spanning multiple reticles. However at the edges of the matrix, a different set of connections will normally be desired. In particular, the signal paths will normally need to "wrap" from one row of cells to a next row of cells (rather than continue to a next successive cell along the same row, for example). It would be desirable to use a single reticle to generate both small scale circuit structures (e.g., of each cell) and large scale circuit structures (such as the scan chain) spanning several reticles on a wafer.

Implementation of a scan chain in a WSI system involves generating circuit structures of the scan chain (e.g. TAPs and scan chain busses) on the wafer. As will be appreciated, if a manufacturing defect severs the scan chain, then the entire wafer becomes both untestable and unconfigurable, and must therefore be discarded. A known method of reducing the effect of this vulnerability is to implement parallel redundant scan chains that follow physically diverse paths through the wafer. For each IC under test, a pair of TAPs perform a boundary scan, and the results are combined using a voting scheme. The use of physically diverse paths reduces the probability that a single defect will sever both chains. Furthermore, the voting scheme implemented for each pair of TAPs reduces the probability that defects at different locations on the wafer (and affecting both chains) will render the scan chain as a whole inoperative. However, if a manufacturing defect has the effect of disabling both of the TAPs testing an IC, then both of the redundant scan chains will be severed, and the scan chain as a whole will fail. In a multi-cell parallel processing system, this situation may arise, for example, when the manufacturing defect affects a large area (covering most or all of a cell), or affects control (e.g. for power supply or clock signal) lines to a cell.

Accordingly, a system architecture for a wafer-scale parallel processing system that remains serviceable in the presence of manufacturing defects, remains highly desirable.

SUMMARY OF THE INVENTION

An object of the present invention is to provide a fault tolerant scan chain that is highly robust to manufacturing defects.

Thus an aspect of the present invention provides a fault tolerant scan chain for a multi-cell parallel processing system having a plurality of independent power domains. The scan chain includes a respective set of parallel Test Access Ports (TAPs) associated with each cell; and a respective voter unit associated with each TAP. Each set of TAPs is designed to scan an Integrated Circuit (IC) of the associated cell, so that the cell is scanned by multiple redundant TAPs. Within each set, each TAP is disposed in a respective different power domain of the parallel processing system. The voter unit associated with each TAP is designed to combine respective output data from each TAP of the set onto its associated scan chain bus.

In preferred embodiments of the invention, each set comprises three TAPs, and is referred to herein as a "triplet" of taps.

In some embodiments, each power domain of the parallel processing system corresponds to a single cell. In such cases, the member TAPs of each set can be located in respective adjacent cells.

Each set of TAPs may include a first TAP and a second TAP. The first TAP is arranged in the associated cell and adapted to perform a boundary scan of the IC. The second TAP is coupled to the first TAP for receiving boundary scan test results from the first TAP, and is designed to process the received boundary scan test results independently of the other TAPs of the set.

Each TAP may be IEEE 1149.1 compliant, and may include a bypass register and an instruction register. Each TAP is preferably controlled by a respective independent TAP controller.

The first TAP may further include a test data register designed to latch test data into the IC of the associated cell, and latch test output data out of the IC. A first distribution line may be provided to convey the test output data latched out of the IC by the primary TAP to the second TAP.

In some embodiments, the primary TAP includes a configuration register designed to control a configuration of the associated cell. This configuration register may include one or more configuration switches adapted to control coupling of the associated cell to a communications bus, based on configuration data latched into the configuration register. A second distribution line may be provided to convey configuration data latched through the configuration register to the second TAP. The configuration may include a selected one of: a default configuration in which the cell is coupled for communication through a respective access point of an associated communications bus; a substitute configuration in which the cell is coupled for communication through the respective access point of another cell; and a disabled configuration in which the cell is disabled.

In some embodiments, an input dummy cell is associated with a first set of TAPs of the scan chain, and operates to distribute input data to each of the parallel scan chain busses. The input dummy cell may, for example, include: a valid TAP designed to function as a second TAP of the first set; and a delay TAP designed to control a timing of input data received by each of the TAPs of the first set.

In some embodiments, an output dummy cell is associated with a last set of TAPs of the scan chain, and operates to combine output data from each respective scan chain bus into a single output bus. The dummy output cell may, for example, include a valid TAP designed to function as a second TAP of the last set; and a voter unit designed to combine respective output data from each TAP of the last set onto the output bus.

Thus the present invention provides a highly robust fault tolerant scan chain suitable for scanning (and/or controlling a configuration of) a parallel processing system. The scan chain implements parallel redundant scan chains that follow physically diverse paths through the parallel processing system. For each IC under test, a set of redundant TAPs perform a boundary scan, and the test results are combined by voting. The TAPs of each set are physically diverse, in that they are physically located in separate power domains of the parallel processing system. As a result, the scan chain is robust to defects affecting power and/or control signal supply to any one power domain. Respective input and output dummy cells at opposite extreme ends of the scan chain provide a graceful separation and recombination of the redundant parallel scan chains, and so renders the architecture of the scan chain transparent to external boundary scan circuit elements.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
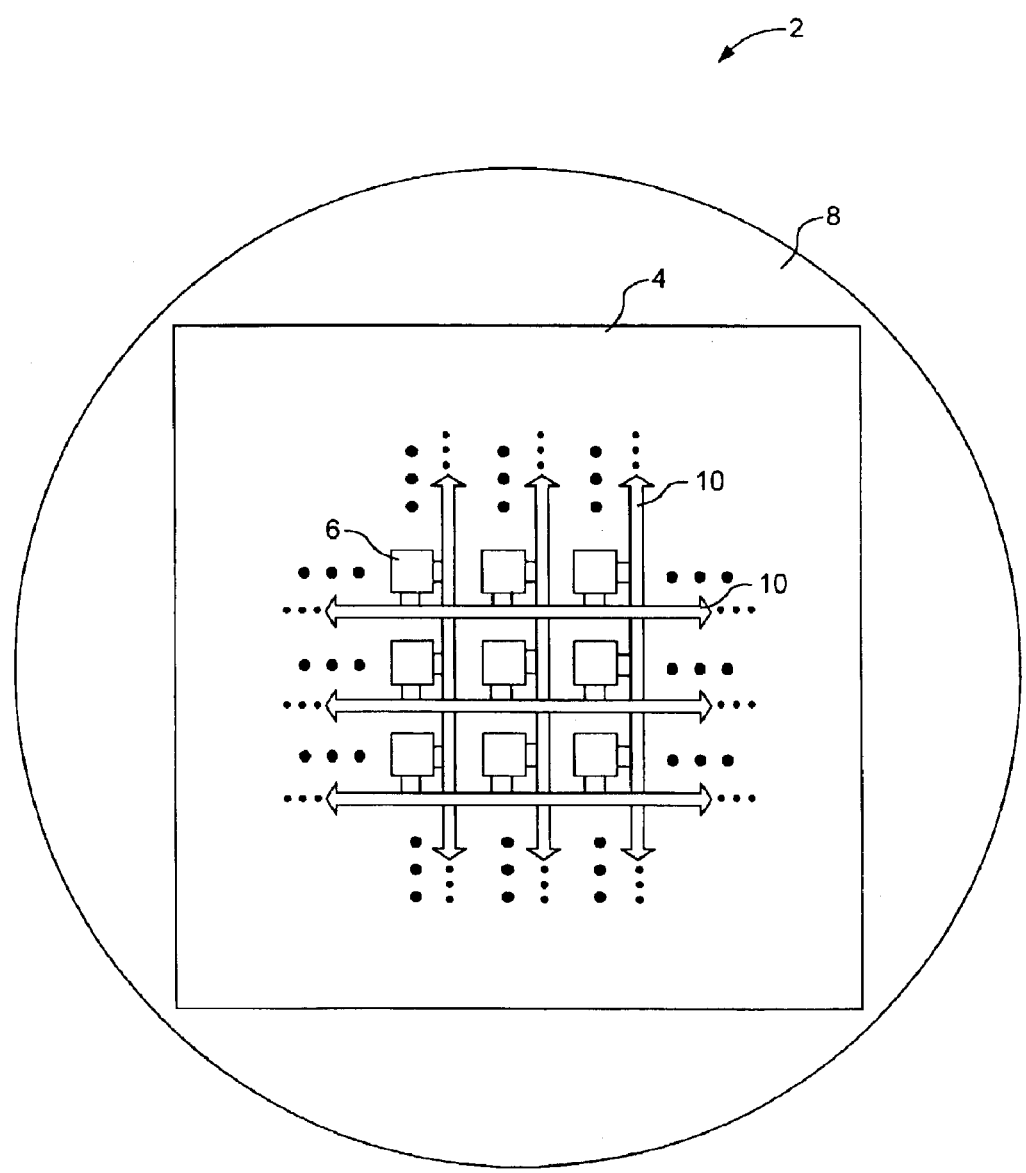
FIG. 1 is a schematic illustration of a parallel processing system arranged on the surface of a substrate, in accordance with an embodiment of the present invention.

The present invention provides a fault tolerant scan chain for a wafer-scale parallel processing system. FIG. 1 schematically illustrates principle features of an exemplary wafer-scale parallel processing system in which the present invention may be deployed.

As shown in FIG. 1, the wafer-scale parallel processing system 2 generally comprises a rectangular (other shapes are possible) matrix 4 of substantially identical cells 6 disposed on a wafer 8 (or, more broadly, a substrate 8). A mesh of communications busses 10 link the cells 6 and carry data signals between cells 6 within the matrix 4, and between the matrix 4 and external devices (not shown). Each communications bus 10 is associated with a respective set (i.e., a row or a column) of cells 6, and includes a plurality of parallel channels (not shown), which may be configured to carry serial or parallel data signals. Each communications bus 10 includes a respective access point for each one of its associated cells 6, and through which a cell 6 can be coupled to the communications bus 10.

The matrix 4 is preferably divided into a plurality of independent power domains (not shown). Each power domain is supplied through a respective unique set of control lines (providing power, clock signals etc.), so that defects affecting the control lines of one power domain will not affect neighboring power domains. Preferably, each power domain encompasses a single cell. With this arrangement, the necessary control lines for each power domain (cell) can conveniently be incorporated into the cell's associated communications bus, and accessed by the cell through the respective access point. As a result, the effects of a loss of power or clock signals to any one cell are limited to that cell.

A highly fault tolerant architecture of the parallel processing system can be obtained using a configurable interface (not shown) designed to dynamically couple a selected one of a cluster of cells to each access point on a communications bus 10. As a result, if any cell 6 is inoperative, another cell 6 can be coupled to the respective access point of the failed cell, and so function as a substitute for the failed cell. Similarly, an inoperative communications bus 10 can be avoided by "bulk substitutions" of all of the cells associated with the failed bus.

The fault-tolerant scan chain of the present invention provides a highly robust system for verifying the operation of each cell 6 within the matrix 4. The scan chain can also be used to control the configurable interface as required to compensate for any detected inoperative cells or busses.

In general, the scan chain of the present invention implements a set of parallel redundant scan chains that follow physically diverse paths through the substrate. In that respect, the term "physically diverse paths" should be understood to mean that, wherever possible, the elements of each chain are kept far enough apart that a single manufacturing defect (e.g. due to a dust particle on the substrate) is unlikely to affect more than one chain. For each IC under test, a set of TAPs perform a boundary scan, and the test results are combined by a voting scheme. In addition to path diversity, each of the TAPs of a set are physically diverse. That is, each TAP is located in a respective different power domain of the matrix 4.

As a result of the physical diversity of the TAPs, a loss of power (and/or clock or other control signals) to any one power domain of the matrix 4 will not render the scan chain as a whole inoperative. Consequently, the scan chain is significantly more robust to manufacturing flaws than prior art scan chains. FIG. 2 schematically illustrates principle elements of a scan chain 12 in accordance with a first embodiment of the present invention.

Figure 2A:
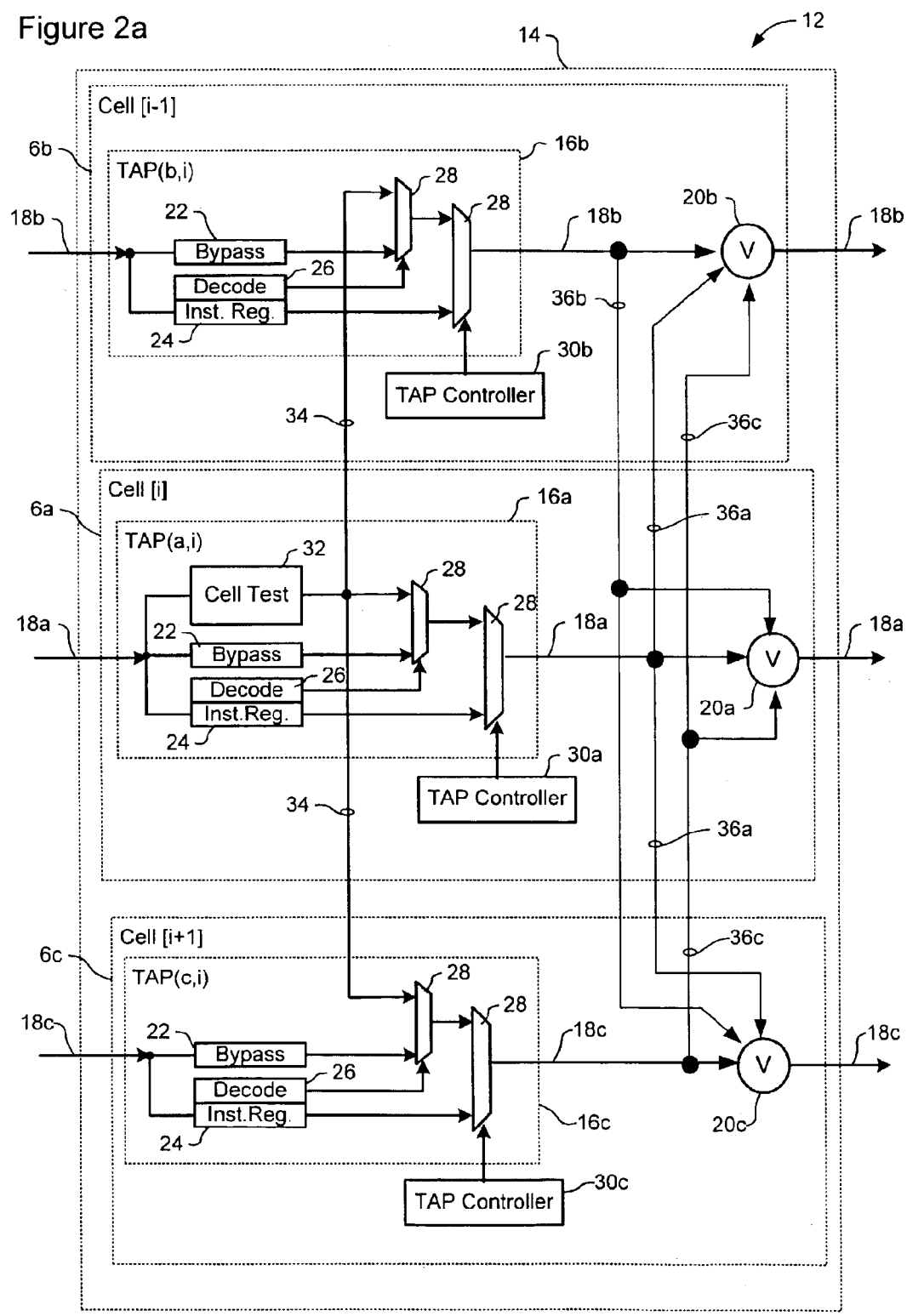
FIGS. 2a and 2b are schematic illustrations showing principle elements and connections of a triplet of a fault tolerant scan chain in accordance with respective alternative embodiment of the present invention.

As shown in FIG. 2a, the scan chain 12 comprises a respective set 14 of three (hereinafter, a triplet) redundant Test Access Ports (TAPs) 16 for testing each cell 6. In the illustrated embodiments, a triplet 14 of TAPs 16 are used to test each cell 6. However, it will be appreciated that the scan chain 12 of the present invention may equally be implemented with more than three TAPs 16 per cell 6, if desired. Each TAP 16 of the triplet 14 is coupled to a respective scan chain bus 18, which follows a physically diverse path through the matrix 4. A 3-way voter 20 within each chain bus 18 operates to combine test results generated by the three TAPs 16. In the illustrated embodiment, each TAP 16 is designed to implement a boundary scan substantially in accordance with IEEE 1149.1. Thus each TAP 16 includes a bypass register 22; instruction register 24; instruction decoder 26 and mutiplexers (Muxs) 28, all of which are controlled by a TAP controller 30. In keeping with the location of the TAPs 16 in respective different power domains (cells), each TAP 16 is also controlled by a respective independent TAP controller 30. This arrangement has the advantage that a fault affecting a TAP controller 30 will only affect one TAP 16 of the triplet 14.

In the illustrated embodiment, the three TAPs 16 of the triplet 14 are respectively located within cells [i−1], [i] and

[i+1], and operate in parallel to test cell [i]. Accordingly, only one of the TAPs 16 of the triplet 14 (i.e. TAP[a,i] 16a) includes a test data register 32 which operates to latch test input data (D-in) into, and test output data (D-out) out of, the cell[i]. The output data (D-out) is then passed to each of TAPs[b,i] 16b and [c,i] 16c (respectively located in cells[i−1] 6b and [i+1] 6c) via respective distribution lines 34. As a result each TAP 16 of the triplet 14 can independently process the test output data (D-out) in accordance with instruction codes received through its respective scan chain bus 18. The output data generated by each TAP 16 is then forwarded to each voter 20, via respective vote lines 36. Each voter 20 operates in a conventional manner to pass output data received from a selected one of the TAPs 16 to the next triplet 14 of the scan chain 12.

Advantages of using IEEE 1149.1 TAPs and TAP controllers include a significant amount of industry acceptance and experience with such this type of scan chain, as well as its flexibility. For example, a conventional IEEE 1149.1 scan chain has an external appearance of a linear shift register, in which every TAP can be represented by a unique set of addresses. This enables instruction code and test data (D-in) to be prepared and "latched in" to a specific TAP in order to test a specific cell. Output data (D-out) generated by that cell can then be "latched out" of scan chain for further analysis. In this context, the use of three physically diverse IEEE 1149.1 compliant TAPs testing each cell, in accordance with the present invention, does not alter the external appearance of the scan chain 12, and thus is transparent to any external devices controlling the scan chain 12. However, in this case, a block of addresses within the scan chain 12 will address a triplet 14, rather than any one TAP 16 within that triplet 14.

Figure 2B:
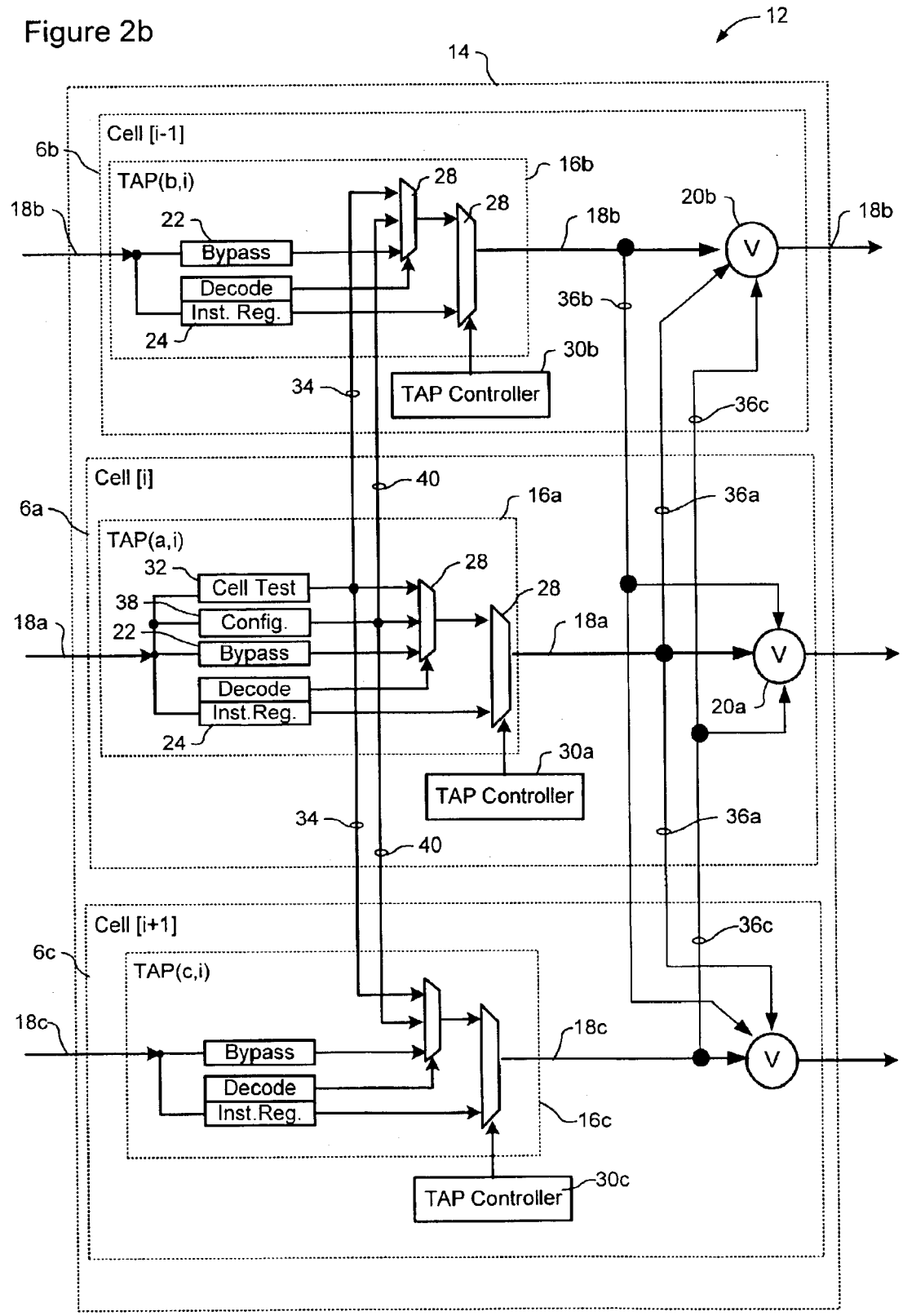

Flexibility of the IEEE 1149.1 standard is represented, at least in part, by the provision of a "user defined" register, which may be used in parallel with (and in a manner similar to) the test data register 32. This feature can be used to enable control of the configurable interface. In particular, a configuration register 38 can be added to TAP[i], as shown in FIG. 2b. In this case, the configuration register 38 is used to latch control data into a set of configuration switches within cell[i] 6a, and thereby control the connectivity between the cell and its associated communications bus 10. For example, an access configuration switch (not shown) can be provided in cell[i], which is designed to couple a selected one of a cluster of cells to cell[i]'s access point on the communications bus 10. Within the scan chain 12, the access configuration switch can be represented as a set of addresses of the configuration register 38, and into which configuration data can be latched to select one of the cluster of cells.

As mentioned previously, physical diversity of the TAPs 16 is obtained by locating each TAP 16 in a respective different power domain of the matrix 4. In the illustrated embodiment, a power domain corresponds to a single cell, so that the TAPs 16 can be located in respective different cells of the matrix 4. In a WSI parallel processing system, it is often convenient to implement the scan chain 12 on a per-row (or per-column) basis within the matrix 4. In this case, each of the three TAPs 16 can suitably be arranged in respective adjacent cells of the same row (or column). Other arrangements can be suitably implemented as desired, provided only that each TAP 16 is located in a respective different power domain of the matrix 4.

Figure 3:
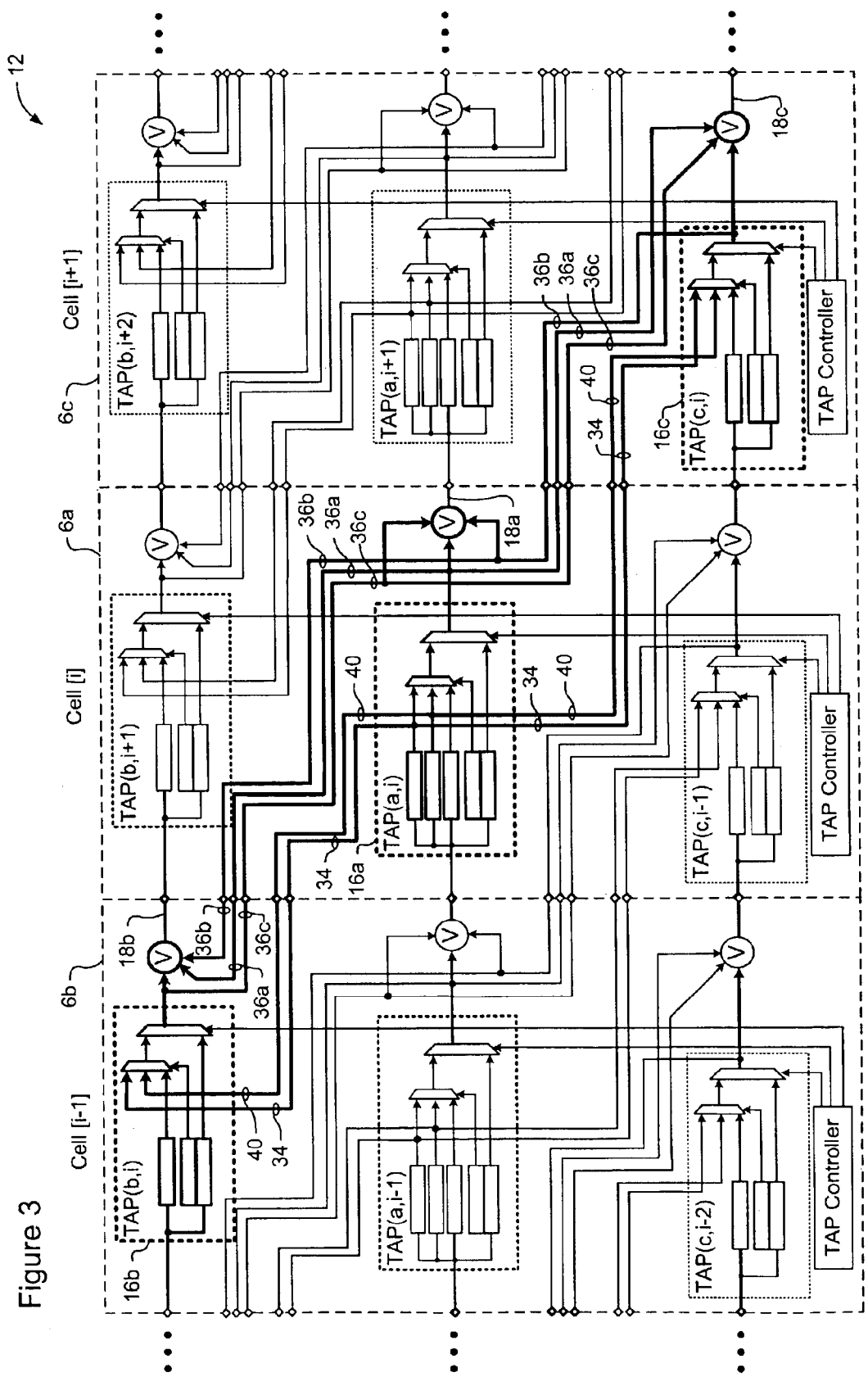
FIG. 3 schematically illustrates a multi-cell scan chain constructed using the triplet 14 of FIG. 2b.

FIGS. 3 and 4 schematically illustrate an implementation of a scan chain in accordance with the present invention within the parallel processing system of FIG. 1. FIG. 3 schematically illustrates a portion of a scan chain 12 in accordance with an embodiment of the present invention, including the triplet 14 of FIG. 2b distributed across three adjacent cells of a row of the matrix. FIG. 4 schematically illustrates exemplary "input" and "Output" dummy cells respectively used to initiate and terminate the scan chain to ensure transparency for conventional external control circuits (not shown).

As shown in FIG. 3, the scan chain 12 of the present invention can be mapped through a row of the matrix 4 using an identical pattern of circuit traces in each cell 6. Designing circuit traces of the scan chain 12 on a "per-cell" basis allows the cell to be repeated indefinitely to construct a scan chain 12 of any arbitrary length (constrained primarily by the size of the cell on the matrix 4 and the dimensions of the matrix 4 itself). Each cell 6 includes three TAPs 16, each of which is a member of a respective different triplet 14 for testing a respective cell.

As may be seen in FIG. 3, the triplet 14 of FIG. 2b is distributed across the cells [i−1], [i], and [i+1]. TAP[a,i] 16a is located within cell[i] 6a, and includes test and configuration registers 32 and 38, as described above. The test and configuration registers 32 and 38 are coupled to TAP[b,i] 16b (in Cell[i−1] 6b) and TAP[c,i] 16c (in Cell[i+1] 6c) via distribution lines 34 and 40, so that output data can be forwarded to each of these TAPs 16 for processing. Finally, voter lines 36 convey output data generated by each TAP 16 to a respective voter unit 20 on each scan chain bus 18. As mentioned previously, these voter units 20 operate in a manner known in the art to pass data received from a selected one of the TAPs 16 to a next successive TAP 16 on the respective scan chain bus 18.

As mentioned above, by repeating the per-cell pattern of circuit traces shown in FIG. 3, a scan chain 12 can be made to any desired length. Each cell covered by the scan chain can be tested, and its configuration controlled, using known techniques in accordance with the IEEE 1149.1 standard. This is accomplished using a single set of test data and configuration registers 32 and 38 located in each cell, and a triplet 14 of physically diverse TAPs 16. As a result, it is possible for a single fault to render a cell non-testable. For example, a fault that renders TAP[a,i] 16a inoperative could prevent either of TAPs[b,i] 16b or[c,i] 16c from receiving valid test output data from TAP[a,i] 16a. However, this fault will not cause the entire scan chain 12 to fail, but rather will be detected as a failure of cell[i] 6a. In response to this detected failure, configuration control data can be latched into the respective configuration registers 38 of neighboring cells[i−1] 6b and [i+1] 6c to isolate (and therefore disable) the "failed" cell[i] 6a.

As is well known in the art, the IEEE 1149.1 standard is based on the use of a single scan chain. This chain can be transparently replaced by redundant parallel chains, provided that each of the chains are coupled together such that instruction codes and data latched into the scan chain (through a single input) will arrive simultaneously at corresponding TAPs 16 in each of the redundant chains. In prior art systems, this is easily accomplished, because corresponding TAPs 16 in the redundant chains are located in the same cell. However, in the scan chain of the present invention, the TAPs 16 are physically diverse. A simple junction between the involved chain busses 18 would produce the undesirable result that instruction codes and data latched into the scan chain 12 will arrive simultaneously at the three TAPs 16 within the same cell, rather than the TAPs 16 of the same triplet 14. Furthermore, one TAP 16 will be missing from the respective triplets 14 scanning each of the cells at the extreme ends of the scan chain 12.

Accordingly, the scan chain 12 of the present invention provides respective input and output "dummy cells" 42 and 44 for gracefully initiating and terminating the scan chain 12. FIG. 4 illustrates each of the input and output dummy cells 42 and 44 respectively, implemented in respect of the scan chain of FIG. 3.

The input dummy cell 42 may be located either on or off the matrix 4, as desired. In either case, the input dummy cell 42 will normally be located outside of the cell matrix 4. In general, the input dummy cell 42 provides: a valid TAP 16, voter 20, and associated distribution and voter 20 lines for completing the first cell's triplet 14; and a delay TAP 46 for ensuring a proper timing of data in each of the three redundant chains.

Figure 4A:
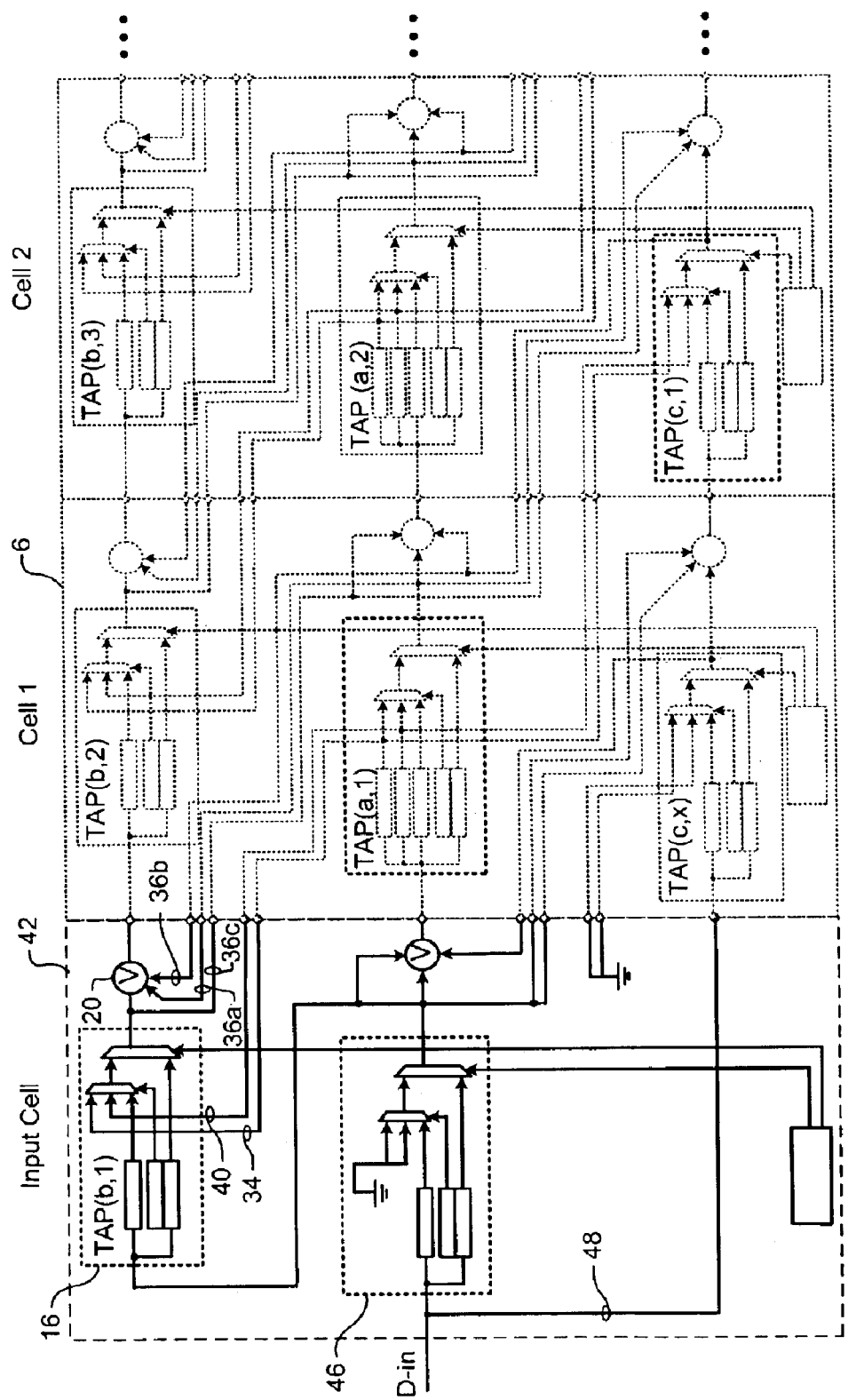
FIGS. 4a and 4b schematically illustrate input and output dummy cells usable in conjunction with the multi-cell scan chain of FIG. 3.

As shown in FIG. 4a, the valid TAP 16 and voter 20 are constructed to complement each of the other TAPs 16 (and voter units 20) of the first triplet 14. As such, distribution lines 34 and 40 are provided for receiving output data from TAP 16(a,1) in cell[1]. Similarly, voter lines 36 are provided for sending (and receiving) output data to (and from) each of the other TAPs 16 of the first triplet 14.

The delay TAP 46 is used to ensure a proper timing of instruction codes and data at each of the TAPs 16 of the first triplet 14 (and, by extension, each of the other triplets of the chain 12). In general, the delay TAP 46 is constructed as a conventional TAP, including bypass and instruction registers; instruction decoder; and muxs. As a result, input data (D-in) latched through the delay TAP 46 incurs a delay (due to latency within the delay TAP 46) equal to that incurred within an active TAP 16 within the remainder of the scan chain 12. The output of the delay TAP 46 is coupled to the input of the input cell's valid TAP 16, and, via a "dummy" voter, TAP(a,1) of the first cell. The dummy voter is used to generate an input signal for TAP(a,1) using the outputs of the delay TAP 46 and TAP(c,x) of cell[1]. In an alternative embodiment, the dummy voter may be omitted, in which case the associated output TAP(c,x) of cell[1] would be left floating.

A bypass line 48 routes the input data D-in to TAP(c,x) of cell[1], avoiding the delay TAP 46. TAP(c,x) does not participate in any triplet 14, but does cause a delay (due to latency) equal to that incurred within the delay TAP 46. Thus it will be seen that the input data D-in will be latched through the delay TAP 46 of the input cell, and TAP(c,x) of cell[1], and be simultaneously received at the respective inputs of each of TAPs[b,1], [a,1] and [c,1] forming the first triplet 14 of the scan chain 12.

Figure 4B:
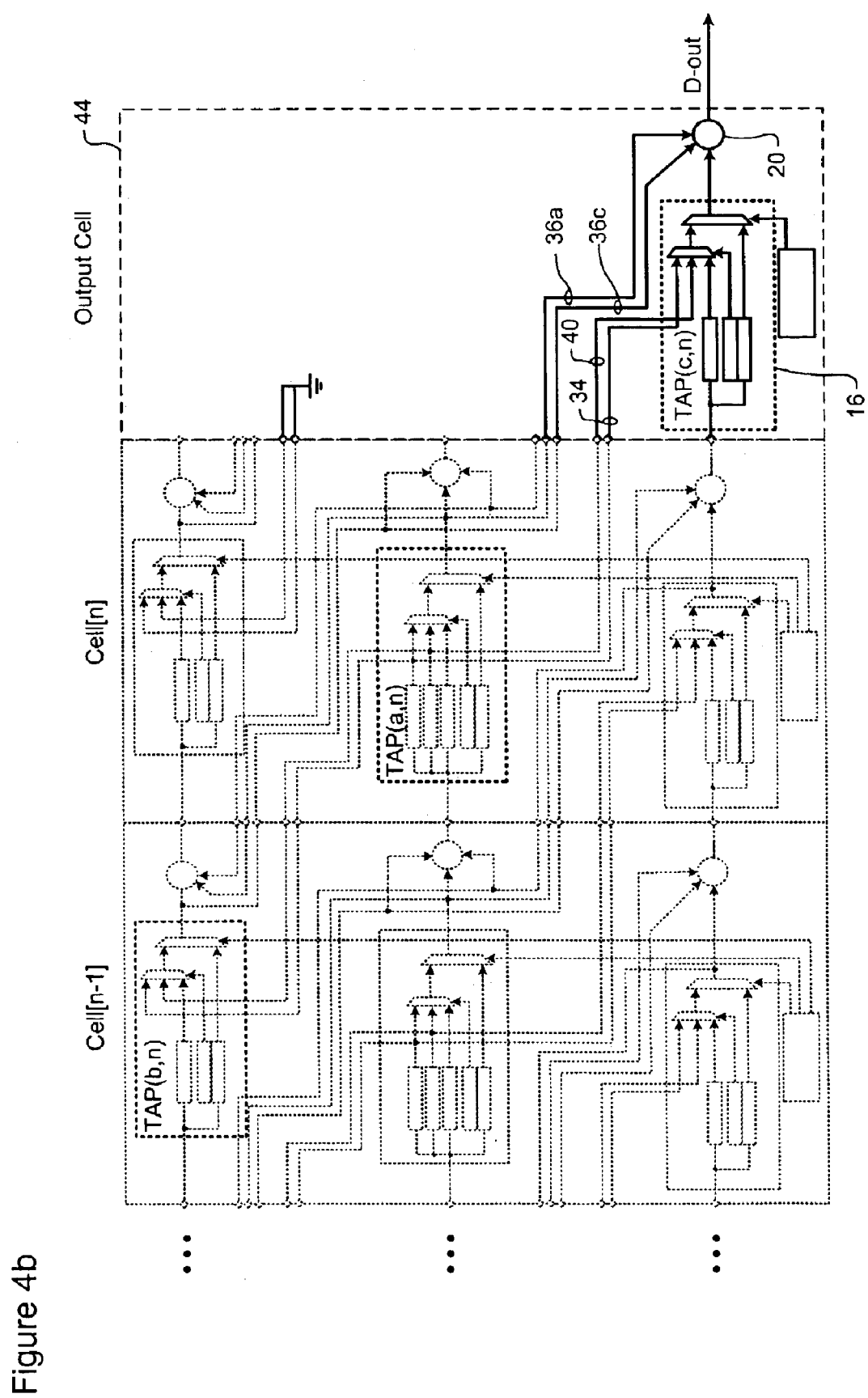

Like the input dummy cell 42, the output dummy cell 44 may be located either on or off the matrix 4, as desired. In either case, the output dummy cell 44 will normally be located outside of the cell matrix 4. As shown in FIG. 4b, the output dummy cell 44 provides a valid TAP(c,n) 16 for completing the last cell's triplet 14, and a voter 20 for combining the results of each of the three chains onto a single output line. As such, distribution lines 34 and 40 are provided for receiving output data from TAP(a,n) in cell[n]. Voter lines 36a,b are provided for receiving output data from each of TAPs(a,n) and (b,n) of the last triplet 14. As described above, the voter unit 20 operates to pass data received from a selected one of TAPs(a,n), (b,n) and (c,n) as output data (D-out) for further processing.

Thus it will be seen that the present invention provides a highly robust fault tolerant scan chain suitable for scanning (and/or controlling a configuration of) a parallel processing system. The scan chain of the present invention implements a set of three parallel redundant scan chains that follow physically diverse paths through the matrix 4. For each IC under test, a triplet 14 of TAPs 16 perform a boundary scan, and the test results are combined using 3-way voting. The TAPs 16 of each triplet 14 are physically diverse, in that they are physically located in separate power domains of the matrix 4. As a result, the scan chain is robust to defects affecting power and/or control signal supply to any one power domain. Respective input and output dummy cells at opposite extreme ends of the scan chain provide a graceful separation and recombination of the three parallel scan chains, and so renders the architecture of the scan chain transparent to external boundary scan circuit elements.

The embodiments of the invention illustrated herein are in the context of a wafer-scale parallel-processing system. A person skilled in the art will readily understand that the invention can be equally practiced with other suitable substrates, and on any desired scale.

The embodiment(s) of the invention described above is (are) intended to be exemplary only. The scope of the invention is therefore intended to be limited solely by the scope of the appended claims.

We claim:

1. A fault tolerant scan chain for a multi-cell parallel processing system having a plurality of independent power domains, the scan chain comprising:
   a set of parallel Test Access Ports (TAPs) adapted to scan an Integrated Circuit (IC) of an associated cell, each TAP of the set being disposed in a respective different power domain of the parallel processing system; and
   a respective voter unit associated with each TAP of the set, each voter unit being adapted to combine output data from each TAP of the set onto an associated scan chain bus.

2. A scan chain as claimed in claim 1, wherein each set comprises three TAPs.

3. A scan chain as claimed in claim 1, wherein each power domain corresponds to a single cell of the parallel processing system.

4. A scan chain as claimed in claim 3, wherein the TAPs of each set are located in respective adjacent cells.

5. A scan chain as claimed in claim 1, wherein each set of TAPs comprises:
   a first TAP disposed in the associated cell and adapted to perform a boundary scan of the IC; and
   a second TAP coupled to the first TAP for receiving boundary scan test results from the first TAP, the second TAP being adapted to process the received boundary scan test results independently of any other TAP of the set.

6. A scan chain as claimed in claim 5, wherein each TAP is IEEE 1149.1 compliant.

7. A scan chain as claimed in claim 5, wherein each TAP comprises a bypass register and an instruction register.

8. A scan chain as claimed in claim 7, wherein the first TAP further comprises a test data register adapted to latch test data into the IC of the associated cell, and latch test output data out of the IC.

9. A scan chain as claimed in claim 8, further comprising a respective first distribution line adapted to convey the test output data latched out of the IC by the first TAP to the second TAP.

10. A scan chain as claimed in claim 5, wherein each TAP is controlled by a respective independent TAP controller.

11. A scan chain as claimed in claim 5, wherein the first TAP further comprises a configuration register adapted to control a configuration of the associated cell.

12. A scan chain as claimed in claim 11, wherein the configuration register comprises one or more configuration switches adapted to control coupling of the respective cell to a communications bus, based on configuration data latched into the configuration register.

13. A scan chain as claimed in claim 12, further comprising a respective first distribution line adapted to convey configuration data latched through the configuration register by the first TAP to the second TAP.

14. A scan chain as claimed in claim 11, wherein the configuration comprises a selected one of:
- a default configuration in which the cell is coupled for communication through a respective access point of an associated communications bus;
- a substitute configuration in which the cell is coupled for communication through the respective access point of another cell; and
- a disabled configuration in which the cell is disabled.

15. A scan chain as claimed in claim 5, further comprising an input dummy cell associated with a first set of TAPs of the scan chain and adapted to distribute input data to each respective scan chain bus.

16. A scan chain as claimed in claim 15, wherein the input dummy cell comprises:
- a valid TAP adapted to function as a second TAP of the first set; and
- a delay TAP adapted to control a timing of input data received by each of the TAPs of the first set.

17. A scan chain as claimed in claim 5, further comprising an output dummy cell associated with a last set of TAPs of the scan chain and adapted to combine output data from to each respective scan chain bus into a single output bus.

18. A scan chain as claimed in claim 17, wherein the output dummy cell comprises:
- a valid TAP adapted to function as a second TAP of the last set; and
- a voter unit adapted to adapted to combine respective output data from each TAP of the last set onto the output bus.

* * * * *

UNITED STATES PATENT AND TRADEMARK OFFICE
CERTIFICATE OF CORRECTION

PATENT NO. : 6,928,606 B2
DATED : August 9, 2005
INVENTOR(S) : Yvon Savaria and Meng Lu It is certified that error appears in the above-identified patent and that said Letters Patent is hereby corrected as shown below:

<u>Title page,</u>
Item [73], should read as follows:
-- Assignee: 4198638 Canada Inc., Montreal, CA --.

Signed and Sealed this

Fourth Day of October, 2005

JON W. DUDAS
*Director of the United States Patent and Trademark Office*